United States Patent [19]
Chengson et al.

[11] Patent Number: 5,811,997
[45] Date of Patent: Sep. 22, 1998

[54] MULTI-CONFIGURABLE PUSH-PULL/OPEN-DRAIN DRIVER CIRCUIT

[75] Inventors: David P. Chengson, Aptos; Robert A. Conrad, Sunnyvale, both of Calif.

[73] Assignee: Silicon Graphics, Inc., Mountain View, Calif.

[21] Appl. No.: 638,186

[22] Filed: Apr. 26, 1996

[51] Int. Cl.$^6$ .................................................. H03K 11/007
[52] U.S. Cl. ............................ 327/112; 327/108; 326/30; 326/83; 326/86
[58] Field of Search ..................................... 327/394, 399, 327/108, 170, 365, 312, 379, 380, 381, 387, 333, 112; 326/56, 30, 83, 59, 57

[56] References Cited

U.S. PATENT DOCUMENTS

| | | | |
|---|---|---|---|
| 5,025,178 | 6/1991 | Nunally | 326/83 |
| 5,028,819 | 7/1991 | Wei et al. | 326/30 |

FOREIGN PATENT DOCUMENTS

| | | | |
|---|---|---|---|
| 404070211A | 3/1992 | Japan | 326/30 |

*Primary Examiner*—Timothy P. Callahan
*Assistant Examiner*—Dinh Le
*Attorney, Agent, or Firm*—Sterne, Kessler, Goldstein & Fox P.L.L.C.

[57] ABSTRACT

A multi-configurable HSTL/LVCMOS/Open-Drain output driver circuit includes push-pull and open-drain transistors that are selectively enabled/disabled depending upon the desired mode of operation.

21 Claims, 4 Drawing Sheets

MULTI-CONFIGURABLE PUSH-PULL/OPEN-DRAIN DRIVER CIRCUIT

BACKGROUND OF THE INVENTION

1. Field of the Invention

The present invention relates generally to output driver circuits, and more particularly is directed toward an output driver circuit having multiconfigurable modes.

2. Related Art

Generally, output driver circuits are used to drive transmission lines, printed wiring board edges, printed circuit board traces, or the like. In a conventional approach, microprocessor and application specific integrated circuit (ASIC) vendors offer a fixed output driver circuit that is optimized for a single system application. In alternative approaches, vendors offer a fixed output driver circuit that represents a compromise of various system applications.

An example of a conventional output driver circuit is provided in FIG. 1. In this high-level illustration, conventional CMOS output driver circuit 100 is designed to drive transmission line 112. Specifically, output driver circuit 100 includes PMOS pull-up transistor 104, NMOS pull-down transistor 106, and electrostatic discharge (ESD) reverse biased diodes 108 and 110. In this push-pull configuration, a grounded input 122 applied to the gates of PMOS pull-up transistor 104 and NMOS pull-down transistor 106 serves to turn on PMOS pull-up transistor 104 and turn off NMOS pull-down transistor 106. Output 124 is thereby pulled to a high level. Alternatively, if a high input 122 is applied to the gates of PMOS pull-up transistor 104 and NMOS pull-down transistor 106, PMOS pull-up transistor 104 is turned off and NMOS pull-down transistor 106 is turned on. Output 124 is thereby pulled to ground.

The switching speed and drive capabilities of transistors 104 and 106 are dictated by the size of the transistors. Sizing of a transistor is characterized by its semiconductor width-to-length (W/L) ratio. FIG. 2 illustrates the W/L ratio with respect to the physical layout of source region 202, drain region 204, and gate region 206 of a sample transistor.

In a typical example, PMOS pull-up transistor 104 has a W/L ratio of 880 microns/0.5 microns and NMOS pull-up transistor 106 has a W/L ratio of 440 microns/0.5 microns. While larger W/L ratios of transistors 104 and 106 increase the permissible edge rates and hence the system speed, larger W/L ratios also increases the gate-drain and gate-source capacitances of transistors 104 and 106. As the gate-drain and gate-source capacitances of transistors 104 and 106 increase, additional current is required to drive transistors 104 and 106. To compensate, output driver circuit designers often include pre-buffer 102 to drive transistors 104 and 106.

Other considerations that impact the speed at which output driver circuit 100 operates includes system noise. Ground bounce noise and reflection noise are two sources of system noise. In the context of output driver circuit 100, ground bounce noise results from the characteristic of "crowbar current." "Crowbar current" arises during a state transition when PMOS transistor 104 and NMOS transistor 106 are both conducting. FIG. 3 illustrates this effect.

In FIG. 3, a rising transition 302 on output 124 occurs during time Δt. During this time Δt, PMOS pull-up transistor 104 is turning off while NMOS pull-down transistor 106 is turning on. In this transition period, both PMOS pull-up transistor 104 and NMOS pull-down transistor 106 are conducting simultaneously. As a result, a current spike is created. This current spike becomes increasingly significant because the ground designated in FIG. 1 is non-ideal. Specifically, the ground in FIG. 1 also includes the inductance of the bond wire to the package. This inductance combines with the dI/dt (i.e., change in current flow with respect to change in time) of the "crowbar current" to produce a measurable voltage on the ground of output driver circuit 100. As can be appreciated, faster clock speeds produce larger "crowbar currents" due to the shorter transition times. In turn, the larger "crowbar currents" combine with the inductance to the package to produce larger ground bounce noise.

Generally, the ground bounce noise problem exists in other output driver circuits as well. For example, in an open-drain configuration where an active pull-up transistor is replaced with external pull-up resistors, the open drain's NMOS pull-down transistor moves from saturation to off very rapidly. This rapid transition causes a large dI/dt that again combines with the package inductance to produce a similar ground bounce noise effect.

As noted above, the general class of system noise also includes reflection noise. Reflection noise is generated when the output impedance of output driver circuit 100 is not matched to the impedance of transmission line 112. Impedance mismatches frequently arise since integrated circuit designers are not typically involved in the circuit board design process. In other words, integrated circuit designers are not readily aware of the types of transmission lines that the output driver circuits will be driving. Accordingly, the board designer is responsible for insuring compatibility. In one solution, a board designer deals with any reflection noise by allowing any ringing from the reflections to settle prior to sampling. This non-optimal solution requires the system to be run at a slightly slower speed, thereby limiting the performance of the fixed output driver circuit.

Generally, these noise considerations force output driver circuits to be either optimized for specific applications or compromised for multiple applications. With respect to the design for multiple applications, any compromises clearly impact the performance and hence, the desirability of the fixed output driver circuit. With the ever present push towards higher system clock speeds, system designers require maximum output driver circuit performance across a variety of intended processor applications. Thus, what is needed is an output driver circuit that achieves optimum performance across a variety of applications.

SUMMARY OF THE INVENTION

The present invention satisfies the above mentioned needs by providing a configurable output driver circuit. This configurable output driver circuit is enabled by a user for operation in a variety of system configurations including point-to-point and multi-drop high speed transceiver logic (HSTL) levels, point-to-point and multi-drop low voltage CMOS (LVCMOS), and point-to-point and multi-drop open-drain configurations.

Specifically, the output driver circuit of the present invention permits configurability by allowing a user to select either a push-pull or an open-drain mode through the enablement/disablement of selected transistors. Within the push-pull mode, the user is also allowed to select either an HSTL or LVCMOS configuration by selecting an operating voltage.

In the preferred embodiment, the output driver circuit of the present invention is used in a microprocessor. The enablement/disablement process of selecting between the push-pull mode and open-drain mode is done during the power up of the output driver circuit. During this startup period, the microprocessor scans in mode bits to select one of the modes. For the push-pull mode, a PMOS pull-up transistor, an NMOS pull-up transistor, and an NMOS pull-down transistor are enabled, while a PMOS bleed transistor and an NMOS open-drain transistor are disabled. Further in this push-pull mode, the output is passed through a series resistor. For impedance matching, the size of the series resistor is chosen such that the sum of the resistance plus the output impedance of the output driver circuit is equal to the transmission line impedance.

Conversely, in the open-drain mode, the PMOS and NMOS pull-up transistors are disabled, the PMOS bleed transistor (under the control of mode bits) is biased such that a channel is always available for current to flow, and the NMOS pull-down transistor and the NMOS open-drain transistor are turned on when the circuit drives low. Generally, the NMOS open-drain transistor shunts current to a common node instead of requiring it to flow through the series resistor and the NMOS pull-down transistor.

Within the push-pull mode, the selection of an operating voltage further permits the user to configure the output driver circuit to operate in either an HSTL or a LVCMOS push-pull configuration. Specifically, an HSTL push-pull configuration is enabled by connecting $V_{CCQ}$ to approximately 1.5 V. Alternatively, a LVCMOS push-pull configuration is enabled by connecting $V_{CCQ}$ to approximately 3.3 V.

BRIEF DESCRIPTION OF THE FIGURES

The foregoing and other features and advantages of the invention will be apparent from the following, more particular description of a preferred embodiment of the invention, as illustrated in the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Output driver circuits can be used in a variety of applications including driving address and data lines, a system bus interface, or the like. Additionally, a given application may be directed towards a variety of system configurations. Various system configurations can include point-to-point and multi-drop high speed transceiver logic (HSTL) levels, point-to-point and multi-drop low voltage CMOS (LVCMOS), and point-to-point and multi-drop open-drain configurations. LVCMOS is a part of the 3.3 volt logic family, the open-drain configuration is a part of the 3.3 volt or GTL logic family, and the JEDEC standard HSTL is a part of the 1.5 volt logic family.

Figure 1:
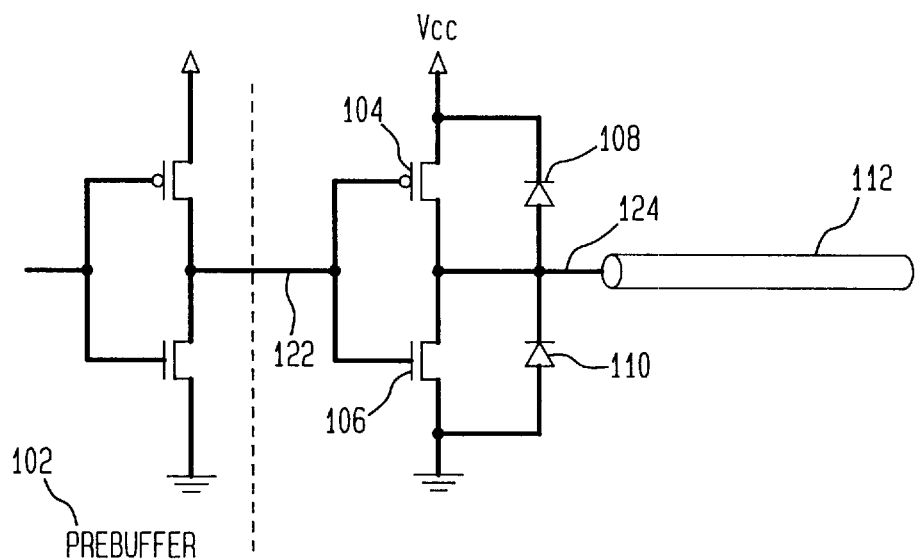
FIG. 1 illustrates a conventional push-pull output driver circuit.
Figure 2:
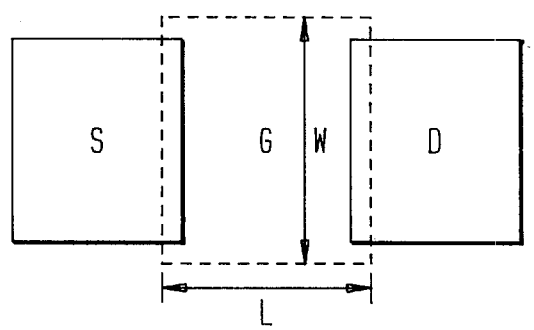
FIG. 2 illustrates the width-to-length ratio of a transistor.
Figure 3:
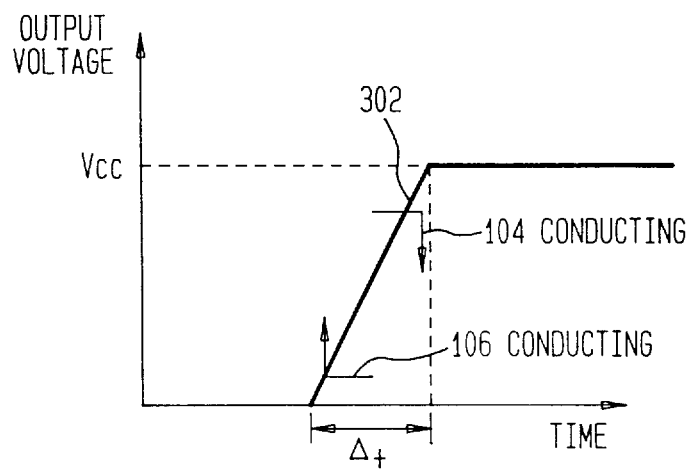
FIG. 3 illustrates the overlap in transistor conduction times that leads to a crowbar current spike in the push-pull transistor pair during a change in state.
Figure 4:
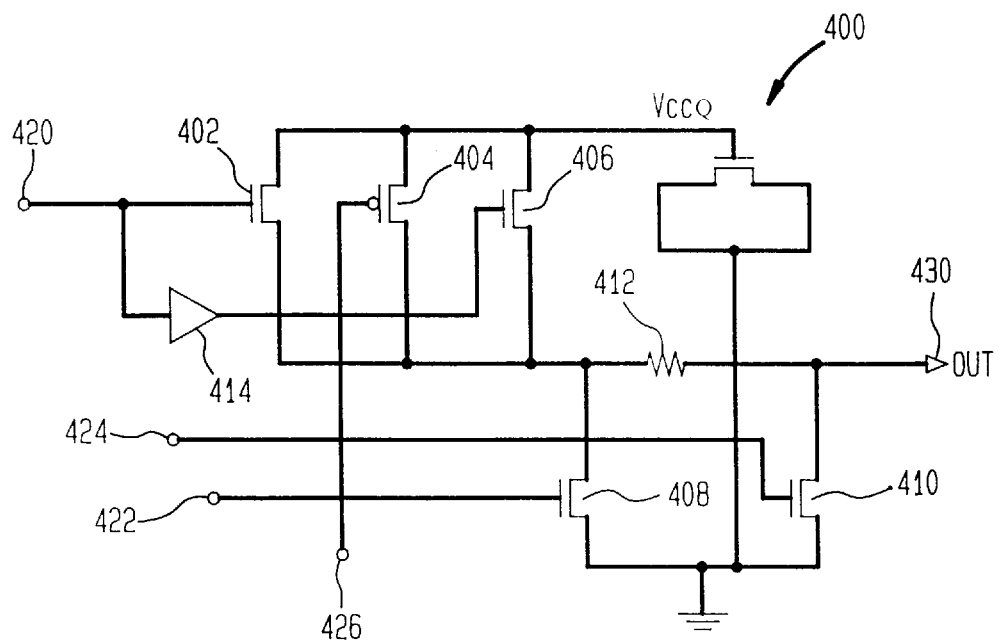
FIG. 4 illustrates a configurable output driver circuit according to the present invention.

Since microprocessors and ASICs can interact with any of these configurations and logic families, an output driver circuit is ideally configurable for a user's intended system application. FIG. 4 illustrates a configurable output driver circuit 400 according to the present invention. Configurable output driver circuit 400 includes transistors 402, 404, 406, 408 and 410 that are selectively enabled/disabled by a microprocessor or ASIC using inputs 420, 422, 424 and 426. Specifically, when a microprocessor or ASIC powers up, it scans in mode bits that identify whether a push-pull or open-rain mode has been selected. The operation of configurable output driver circuit 400 in each of these modes is now described.

Push-Pull Mode

The push-pull mode is used in both HSTL and LVCMOS configurations. A user configures output driver circuit 400 to operate in one of these modes by selecting an operating voltage $V_{CCQ}$. If the user desires output driver circuit 400 to operate in an HSTL mode, the user connects $V_{CCQ}$ to approximately 1.5 V. Alternatively, if the user desires output driver circuit 400 to operate in LVCMOS mode, the user connects $V_{CCQ}$ to approximately 3.3 V.

In a preferred embodiment, the push-pull mode of output driver circuit 400 is optimized for HSTL operation. Specifically, the sikes of transistors 402, 406 and 408 and series resistor 412 are selected to match the impedance of a 65 Ω transmission line when $V_{CCQ}$ is connected to 1.5 V. For this interface and configuration, the preferred embodiment includes NMOS pull-up transistor 402 sized with a width-to-length (W/L) ratio of 150 microns/0.8 microns, PMOS pull-up transistor 406 sized with a W/L ratio of 110 microns/0.8 microns, NMOS pull-down transistor 408 sized with a W/L ratio of 110 microns/0.8 microns, and series resistor 412 sized at 20 Ω.

Generally, since the current-to-voltage (I-V) relationship is a squared function of voltage, the push-pull mode of output driver circuit 400 cannot simultaneously be optimized for both 1.5 V and 3.3 V operation. Accordingly, in LVCMOS operation, where $V_{CCQ}$ is connected to 3.3 V, the output impedance of output driver circuit 400 will not match the impedance of the transmission line. In this configuration, external termination resistors can be added to insure impedance matching. Clearly, in alternative embodiments, the push-pull mode of output driver circuit 400 can be optimized for LVCMOS operation rather than HSTL operation.

In both HSTL and LVCMOS configurations, the microprocessor enables NMOS pull-up transistor 402 and PMOS pull-up transistor 406. The microprocessor also disables PMOS bleed transistor 404 and NMOS open-drain transistor 410. NMOS pull-own transistor 408 is operable in both modes. The operation of PMOS bleed transistor 404 and NMOS open-drain transistor 410 is described in the open-drain section below.

As compared to conventional output driver circuit 100, configurable output driver circuit 400 uses a combination of transistors to provide the pull-up structure. Specifically, rather than a single PMOS pull-up transistor 104, configurable output driver circuit 400 uses one NMOS pull-up transistor 402 and one PMOS pull-up transistor 406. This pull-up structure permits transistors 402 and 406 to be sized with smaller width-to-length (W/L) ratios, thereby permitting prebuffer 102 to be removed. Their operation is now described.

Generally, NMOS transistors are stronger than PMOS transistors. Specifically, NMOS transistors can be sized with smaller W/L ratios while maintaining a given drive capability. In other words, the output transconductance (impedance) of an NMOS transistor is larger (smaller) than PMOS transistors. As a result, a push-pull structure can advantageously use two separately controlled NMOS transistors as compared to the conventional PMOS/NMOS transistor combination.

For example, if output driver circuit 400 did not include PMOS pull-up transistor 406, the push-pull mode would use NMOS pull-up transistor 402 in combination with NMOS pulldown transistor 408. When a high output level is desired, NMOS pull-up transistor 402 is turned on using input 420 and NMOS pull-down transistor 408 is turned off. Conversely, if a low output level is desired, NMOS pull-down transistor 408 is turned on using input 422 and NMOS pull-up transistor 404 is turned off.

The problem with this type of push-pull structure is that the highest voltage that can be obtained at output 430 is $V_{CCQ}-V_T$, where $V_T$ is the threshold voltage of the NMOS transistor. In other words, the highest output voltage is limited by the gate-source voltage drop of NMOS transistor 402. Since, the gate-drain voltage drop of a PMOS transistor is less than the gate-source voltage drop of an NMOS transistor, a push-pull structure having a single PMOS pull-up transistor can produce a higher output voltage. Clearly, any loss in output voltage is significant when encountering narrow noise margins at high-end clock speeds. Accordingly, PMOS transistors are generally chosen as pull-up transistors.

The pull-up structure of the present invention results from the relative operational characteristics of NMOS versus PMOS transistors. Specifically, PMOS pull-up transistor 406 is combined with NMOS pull-up transistor 402 to get the output voltage past $V_{CCQ}-V_T$. The operation of this combination is now described.

During a rising edge, NMOS pull-down transistor 408 is going from on to off and NMOS pull-up transistor 402 is going from off to on. These two transitions are controlled by inputs 422 and 420 respectively. As the output approaches $V_{CCQ}-V_T$, NMOS pull-up transistor 402 starts to turn off and PMOS pull-up transistor 406 starts to turn on. NMOS pull-up transistor 402 and PMOS pull-up transistor are controlled with a single control input 420. This common control input is delayed by delay element 414 to permit PMOS pull-up transistor 406 to turn on after NMOS pull-up transistor 402 has turned on.

Figure 5:
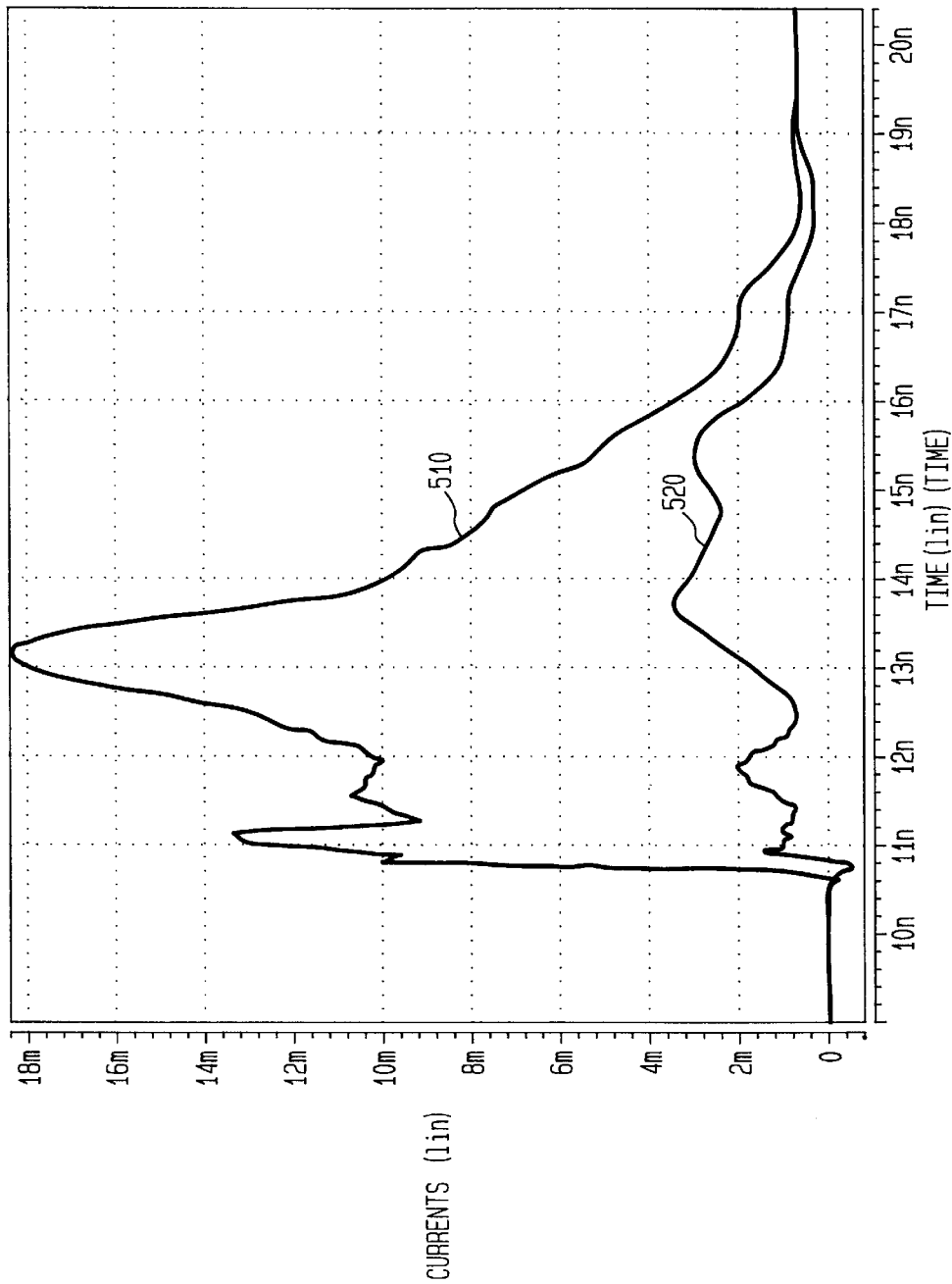
FIG. 5 illustrates the tandem operation of the NMOS and PMOS pull-up transistors.

FIG. 5 illustrates the tandem operation of pull-up transistors 402 and 406. Transient 510 represents the operation of NMOS pull-up transistor 402 and transient 520 represents the operation of PMOS pull-up transistor 406. As this plot demonstrates, the bulk of the current (up to 18 mA) goes through NMOS pull-up transistor 402. Conversely, only 3 mA (peak) goes through PMOS pull-up transistor 406. This peak occurs later in the charge cycle when NMOS pull-up transistor 402 is starting to turn off. In this manner, NMOS pull-up transistor 402 sources most of the current, while PMOS pull-up transistor 406 is used to attain the higher output voltage level.

In accordance with this design, the final sizing of push-pull transistors 402, 406 and 408 was significantly reduced as compared to PMOS pull-up transistor 104 and NMOS pull-down transistor 106 in fixed output driver circuit 100. As noted above in the conventional push-pull structure, PMOS pull-up transistor 104 can have a W/L ratio of 880 microns/0.5 microns while NMOS pull-down transistor 106 can have a W/L ratio of 440 microns/0.5 microns. This is replaced with a push-pull structure where NMOS pull-up transistor 402 and NMOS pull-down transistor 410 each have a W/L ratio of 110 microns/0.8 microns, and PMOS pull-up transistor 406 has a W/L ratio of 150 microns/0.8 microns. Since transistors 402, 406, and 408 have smaller W/L ratios and therefore smaller capacitances, a prebuffer is not required. Moreover, the smaller sizing of transistors 402, 406, and 408 reduces the "crowbar current" which thereby reduces the magnitude of the ground bounce noise.

In addition to addressing the ground bounce noise problem, output driver circuit 400 also addresses the reflection noise problem. As noted above, reflection noise inhibits system performance by limiting the system clock speed. To eliminate this reflection noise, the output impedance of output driver circuit 400 is configured to match the impedance of the transmission line interface. In a preferred embodiment, output driver circuit 400 is configured to drive a transmission line (e.g., system bus, secondary cache address line, or the like) having an impedance that is controlled to 65 Ω. This transmission line can have multiple loads. If multiple loads exist, the stub lengths of the transmission line are controlled to ensure lumped rather than distributed circuit behavior. In other embodiments having various transmission line impedances and configurations, impedance matching is accommodated through the appropriate sizing of the push-pull components.

The sizing of transistors 402, 406 and 408 involve multiple tradeoffs. As noted above, if the push-pull transistors are sized too large, a prebuffer may be required. This prebuffer can introduce additional delay. Conversely, if the push-pull transistors are sized too small, then insufficient drive capability can lead to an intolerable propagation delay through the buffer. Even after an appropriate sizing of transistors 402, 406 and 408 is identified, the impedance matching issue is dependent upon the operating voltage $V_{CCQ}$ (e.g., HSTL v. LVCMOS).

In the preferred embodiment illustrated in FIG. 4, output driver circuit 400 is optimized for HSTL operation. In this configuration, the effective output impedance of transistors 402, 406 and 408 is 20 Ω short of the 65 Ω impedance of the transmission line interface. Accordingly, the preferred embodiment includes a 20 Ω series resistor 412 to prevent any impedance mismatching. This series resistor is generally implemented in semiconductor material as a diffusion resistor. Clearly, the specific value of series resistor 412 is implementation dependent.

Generally, by matching the output impedance to the transmission line impedance, output driver circuit 400 can launch a pulse having half of the voltage value required at the load. Specifically, at the end of the transmission line, where the integrated circuit loads are typically open circuits, the incident wave and reflected wave combine to double the voltage that was launched. In this manner, reflection noise is controlled at the end of the transmission line.

As an additional feature, configurable output driver circuit 400 integrates the electrostatic discharge (ESD) structure as part of the open-drain structure. Specifically, when NMOS open-drain transistor 410 is disabled in the push-pull mode, it has sufficient source-to-drain capacitance to act as an ESD structure for the entire I/O cell.

Open-Drain Mode

In the open-drain mode, $V_{CCQ}$ can be connected to approximately 3.3 V. In contrast to the push-pull mode described above, the enablement/disablement process is reversed. The microprocessor (via mode bits) now enables PMOS bleed transistor 404 and NMOS open-drain transistor 410 and disables NMOS pull-up transistor 402 and PMOS pull-up transistor 406. While NMOS pull-down transistor 408 is operable in the open-drain mode it is not actively switched. During power up, it is turned on and left on. The purpose of NMOS pull-down transistor 408 is to steer the output away from series resistor 412. In a preferred embodiment, NMOS open-drain transistor 410 is sized with a W/L ratio of 110 microns/0.8 microns.

As noted above, the ground bounce noise problem in the open drain mode is created when NMOS open-drain transistor 410 moves from saturation to off very rapidly. In this rapid transition, current from inductors that reside in the path cannot flow through NMOS open-rain transistor 410. Accordingly, a surge of energy is propagated down the line and reflected. This large dI/dt combines with the inductance of the connection between the bond wire and the package to produce measurable voltage on the ground lines and signal lines.

One method of reducing this large dI/dt, and hence the signal noise, is to allow for a continuous current path when NMOS open-rain transistor 410 is turning off. This is done with PMOS bleed transistor 404. PMOS bleed transistor 404 is a smaller transistor (W/L ratio equal to 90 microns/0.8 microns) that is activated when NMOS open-drain transistor 410 is turning off. Specifically, as NMOS open-drain transistor 410 is turning off, PMOS bleed transistor 404 dissipates the energy surge by enabling current to continue to flow. The active switching of PMOS bleed transistor 404 is enabled through input 426.

Figure 6:
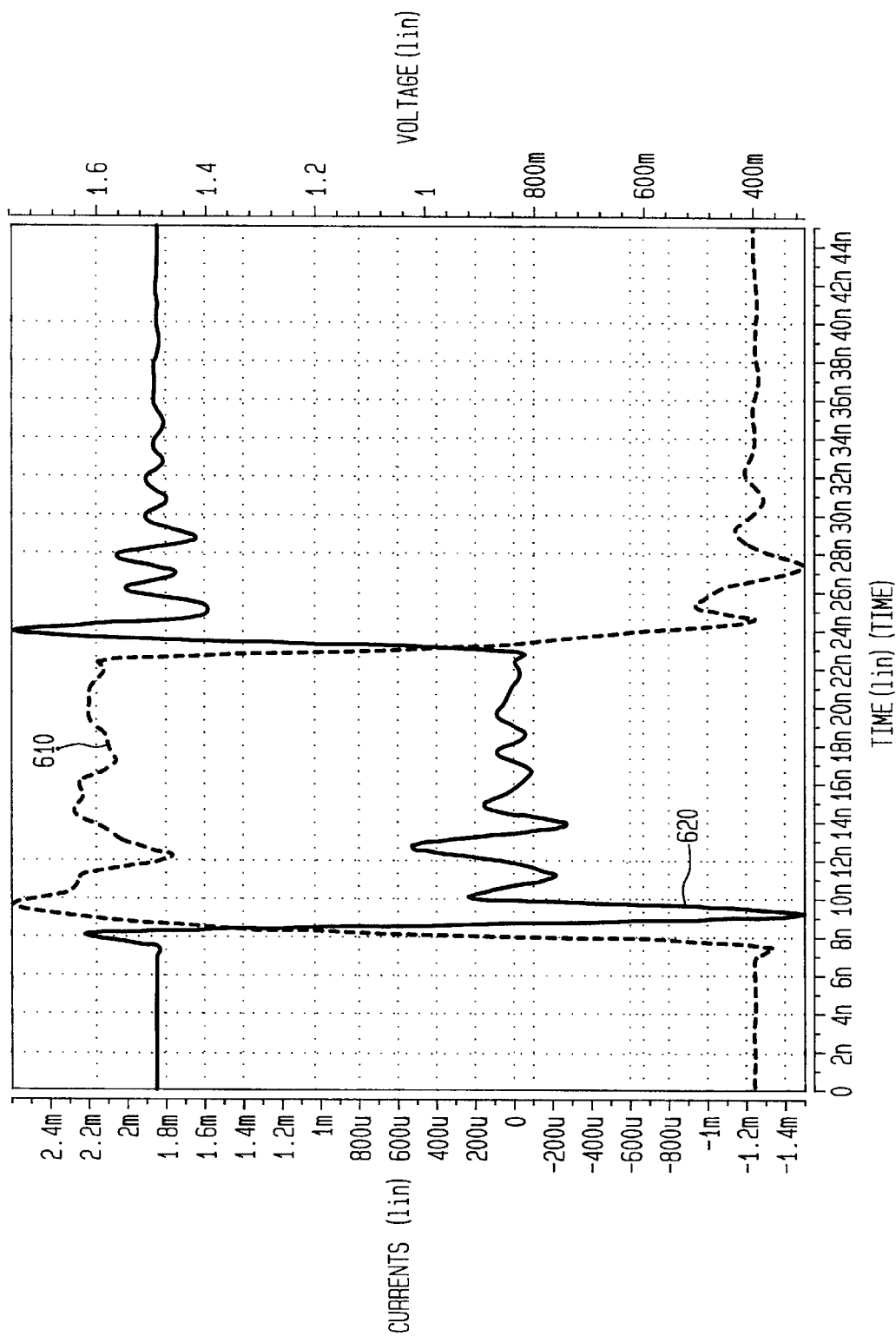
FIG. 6 illustrates the operation of the bleed transistor.

FIG. 6 illustrates the effect of PMOS bleed transistor 404 relative to the switching of NMOS open-drain transistor 410. Transient 610 represents the output voltage. Transient 620 represents the current through PMOS bleed transistor 404. A rising edge on the output voltage is created when NMOS open-drain transistor 410 shuts off. When this occurs, a surge of energy is propagated down the line. This surge of energy is dissipated by PMOS bleed transistor 404 that absorbs severe negative current (−3 mA) in the 11–13 ns range.

While the invention has been particularly shown and described with reference to preferred embodiments thereof, it will be understood by those skilled in the relevant art that various changes in form and details may be made therein without departing from the spirit and scope of the invention.

What is claimed is:

1. A configurable output driver circuit, comprising:

an NMOS pull-up transistor, a drain of said NMOS pull-up transistor coupled to a voltage node, a gate of said NMOS pull-up transistor coupled to a first input, and a source of said NMOS pull-up transistor coupled to a first node;

a PMOS pull-up transistor, a source of said PMOS pull-up transistor coupled to said voltage node, a gate of said PMOS pull-up transistor coupled to said first input, and a drain of said PMOS pull-up transistor coupled to said first node;

a PMOS bleed transistor, a source of said PMOS bleed transistor coupled to said voltage node, a gate of said PMOS bleed transistor coupled to an active control input, and a drain of said PMOS bleed transistor coupled to said first node;

an NMOS pull-down transistor, a drain of said NMOS pull-down transistor coupled to said first node, a gate of said NMOS pull-down transistor coupled to a second input, and a source of said NMOS pull-down transistor coupled to a common node;

an NMOS open-drain transistor, a drain of said NMOS open-drain transistor coupled to an output node, a gate of said NMOS open-drain transistor coupled to a third input, and a source of said NMOS open-drain transistor coupled to said common node; and a resistor coupled between said first node and said output node, wherein said PMOS bleed transistor and said NMOS open-drain transistor are disabled when the configurable output driver circuit is operating in a push-pull mode, and said NMOS; pull-up transistor and said PMOS pull-up transistor are disabled when the configurable output driver circuit is operating in an open-drain mode.

2. The circuit of claim 1, wherein said NMOS pull-up transistor has a W/L ratio of approximately 150 microns/0.8 microns.

3. The circuit of claim 1, wherein said PMOS pull-up transistor has a W/L ratio of approximately 110 microns/0.8 microns.

4. The circuit of claim 1, wherein said PMOS bleed transistor has a W/L ratio of approximately 90 microns/0.8 microns.

5. The circuit of claim 1, wherein said NMOS pull-down transistor has a W/L ratio of approximately 110 microns/0.8 microns.

6. The circuit of claim 1, wherein said NMOS open drain transistor has a W/L ratio of approximately 110 microns/0.8 microns.

7. The circuit of claim 1, wherein said resistor has a value of approximately 20 Ω.

8. The circuit of claim 1, wherein said first input to said PMOS pull-up transistor is delayed with respect to said NMOS pull-up transistor.

9. The circuit of claim 1, wherein if the configurable output driver circuit is operating in HSTL mode, said voltage node is connected to approximately 1.5 V.

10. The circuit of claim 1, wherein if the configurable output driver circuit is operating in either a low-voltage CMOS or open-drain modes, said voltage node is connected to approximately 3.3 V.

11. A configurable output driver circuit, comprising:

at least one pull-up transistor, a drain of said at least one pull-up transistor coupled to a voltage node, a gate of said at least one pull-up transistor coupled to a first input, and a source of said at least one pull-up transistor coupled to a first node;

a pull-down transistor, a drain of said at least one pull-down transistor coupled to said first node, a gate of said pull-down transistor coupled to a second input, and a source of said pull-down transistor coupled to a common node; and an open-drain transistor, a drain of said open-drain transistor coupled to output node, a gate of said open-drain transistor coupled to a third input, and a source of said open-drain transistor coupled to said common node, wherein said first node is connected to said output node via a resistive connection, wherein said open-drain transistor is disabled when the configurable output driver circuit is operating in a push-pull mode, and said at least one pull-up transistor is disabled when the configurable output driver circuit is operating in an open-drain mode.

12. The circuit of claim 11, further comprising a bleed transistor, a source of said bleed transistor coupled to said voltage node, a gate of said bleed transistor coupled to an active control input, and a drain of said bleed transistor coupled to said first node.

13. The circuit of claim 11, wherein said at least one pull-up transistor comprises an NMOS pull-up transistor and a PMOS pull-up transistor, wherein said first input to a gate of said PMOS pull-up transistor is delayed with respect to said NMOS pull-up transistor.

14. The circuit of claim 11, wherein said resistive connection is a series resistor.

15. The circuit of claim 11, wherein said voltage node is connected to a voltage selected from the group of 1.5 V and 3.3 V.

16. In an output driver circuit that includes at least one pull-up transistor, a drain of the at least one pull-up transistor coupled to a voltage node, a gate of the at least one pull-up transistor coupled to a first input, and a source of the at least one pull-up transistor coupled to a first node, at least one pull-down transistor, a drain of the at least one pull-down -transistor coupled to the first node, a gate of the at least one pull-down transistor coupled to a second input, and a source of the at least one pull-down transistor coupled to a common node, and an open-drain transistor, a drain of the open-drain transistor coupled to the first node via a resistive connection, a gate of the open-drain transistor coupled to a third input, and a source of the open-drain transistor coupled to the common node, a method of configuring, the output driver circuit when operating in a push-pull mode, comprising the step of:

(a) enabling the at least one pull-up transistor and disabling the open-drain transistor using mode bits that are scanned in by a microprocessor.

17. The method of claim 16, further comprising the step of:

(b) connecting the voltage node to approximately 1.5 V when operating in an HSTL configuration.

18. The method of claim 16, further comprising the step of:

(b) connecting the voltage node to approximately 3.3 V when operating in a LVCMOS configuration.

19. In an output driver circuit that includes at least one pull-up transistor, a drain of the at least one pull-up transistor coupled to a voltage node, a gate of the at least one pull-up transistor coupled to a first input, and a source of the at least one pull-up transistor coupled to a first node, at least one pull-down transistor, a drain of the at least one pull-down transistor coupled to the first node, a gate of the at least one pull-down transistor coupled to a second input, and a source of the at least one pull-down transistor coupled to a common node, and an open-drain transistor, a drain of the open-drain transistor coupled to the first node via a resistive connection, a gate of the open-drain transistor coupled to a third input, and a source of the open-drain transistor coupled to the common node, a method of configuring the output driver circuit when operating in an open-drain mode, comprising the step of:

(a) enabling the open-drain transistor and disabling the at least: one pull-up transistor using mode bits that are scanned-in by a microprocessor.

20. The method of claim 19, further comprising the step of:

(b) connecting the voltage node to approximately 3.3 V.

21. The method of claim 19, further comprising the step of:

(b) enabling a bleed transistor, wherein a source of said bleed transistor is coupled to said voltage node, a gate of said bleed transistor is coupled to an active control input, and a drain of said bleed transistor is coupled to said first node.

* * * * *